United States Patent [19]

Miller

[11] Patent Number: 4,747,107
[45] Date of Patent: May 24, 1988

[54] SINGLE MODE INJECTION LASER

[75] Inventor: Stewart E. Miller, Middletown Township, Monmouth County, N.J.

[73] Assignee: Bell Communications Research, Inc., Livingston, N.J.

[21] Appl. No.: 916,638

[22] Filed: Oct. 8, 1986

Related U.S. Application Data

[63] Continuation-in-part of Ser. No. 773,123, Sep. 6, 1985, abandoned.

[51] Int. Cl.$^4$ .............................................. H01S 3/19
[52] U.S. Cl. ........................................ 372/44; 372/50
[58] Field of Search ................... 372/26, 50, 19, 32, 372/44, 92; 455/609, 611, 613

[56] References Cited

U.S. PATENT DOCUMENTS

| | | | |
|---|---|---|---|
| 3,518,574 | 6/1970 | Rutz | 455/611 X |
| 3,555,455 | 1/1971 | Paine | 455/611 X |
| 4,426,704 | 1/1984 | Nagai et al. | 372/50 |
| 4,464,762 | 8/1984 | Furuya | 372/50 |
| 4,528,670 | 7/1985 | Burrus, Jr. et al. | 372/44 |
| 4,558,449 | 12/1985 | Gordon | 372/44 |
| 4,622,674 | 11/1986 | Mito | 372/50 X |

FOREIGN PATENT DOCUMENTS 0103688  6/1985  Japan ...................... 372/50

OTHER PUBLICATIONS

Ebeling et al, "Generation of Single-Longitudinal-Mode . . . Semiconductor Lasers", Electronics Letters, vol. 18, No. 21, Oct. 14, 1982, pp. 901–902.
Koyama et al, "Suppression of Intensity . . . Dynamic Single-Mode Laser", Electronics Letters, vol. 19, No. 9, Apr. 28, 1983, pp. 325–327.
O.S.A. Meeting on Optical Fibers Communication–Jan. 23–25, 1984, *Technical Digest* OFC '84, Paper MF2, pp. 14–16.
Toshihio Fujita, et al., "Intensity Noise Suppression and Modulation Characteristics of a Laser Diode Coupled to an Eternal Cavity," *IEEE Journal of Quantum Electronics,* vol. QE-20, No. 5, pp. 492–499, May 1984.
T. Fujita, et al., "Oscillation Frequency Shift Suppression of Semiconductor Lasers Coupled to External Cavity," *Electronics Letters,* vol. 20, No. 10, pp. 416–417, May 1984.

*Primary Examiner*—Eugene R. LaRoche
*Assistant Examiner*—Seung Ham
*Attorney, Agent, or Firm*—James W. Falk; Stephen M. Gurey

[57] ABSTRACT

Longitudinal mode coupling is used in an injection laser to achieve single longitudinal mode output. By imposing a to small amplitude sinusoidal signal to modulate the laser injection current, this coupling is provided by producing sidebands on the photon distributions of the longitudinal modes.

13 Claims, 5 Drawing Sheets

SINGLE MODE INJECTION LASER

BACKGROUND OF THE INVENTION

This application is a continuation-in-part of application Ser. No. 773,123 filed Sept. 6, 1985 now abandoned.

This invention relates to the field of lasers and more specifically to the field of injection lasers.

Present silica-based optical fibers can be fabricated to have a loss in the 1.3–1.6 micron wavelength region which is an order of magnitude lower than the loss occurring at the 0.85 micron wavelength of present lightwave communications systems, e.g., ¼ dB/km versus 2–3 dB/km. Furthermore, these fibers can be fabricated to have a transmission delay distortion in the 1.3–1.6 micron wavelength region which is two orders of magnitude lower than the transmission delay distortion at 0.85 microns, e.g., 1–2 ps/km-nm versus 100+ ps/km-nm. Thus, the dispersion-limited transmission distance for high bit rate lightwave communications systems can be maximized by using a single frequency, i.e., single-longitudinal-mode, injection laser generating output in the 1.3–1.6 micron wavelength region in conjunction low loss fibers. For these reasons, present efforts in the development of lightwave communications systems are aimed at the 1.3–1.6 micron wavelength region instead of at the wavelength region surrounding 0.85 microns.

InGaAsP injection lasers produce output in the desired 1.3–1.6 micron wavelength region. However, typical single-resonator InGaAsP injection lasers have a laser cavity length in the 250–300 micron range. This results in longitudinal mode spacing in a range between 6 and 9 Angstroms. Since the gain spectral width of InGaAsP injection lasers is approximately 1100 Angstroms, there are more than 150 longitudinal modes under the gain spectral width of a 250 micron long laser. In addition, the gain difference between these modes is small, and, as a result, discrimination between the main mode and side modes in InGaAsP injection lasers is poor.

Various structures, aimed at providing single-frequency operation, have been proposed and demonstrated. These include distributed feedback (DFB) and distributed Bragg reflector (DBR) lasers, lasers with an external cavity, injection-locking lasers, short-cavity lasers and coupled-cavity lasers. These laser structures include mode selective loss and suffer from one or more drawbacks: they are difficult to fabricate, they are difficult to operate and/or they require external elements which are sensitive to mechanical vibration.

SUMMARY OF THE INVENTION

Advantageously, in accordance with the teachings of the present invention, coupling between longitudinal modes is used to produce a nearly single mode injection laser. This coupling substantially eliminates the need to utilize mode selective means, such as wavelength dependent reflective means, with the laser. Specifically, coupling between adjacent modes causes the laser to oscillate in a single longitudinal mode, that mode being the longitudinal mode at the peak of the active or gain material gain distribution.

An embodiment of the inventive injection laser which provides this narrow bandwidth output comprises an active or gain material disposed in a laser cavity which is fabricated so that the longitudinal modes have narrow spectral widths. The laser further comprises means for spreading the photon distributions of the narrow longitudinal modes to such an extent that there is substantial overlap between adjacent modes. This means for spreading the photon distribution of the longitudinal modes comprises means for modulating the laser injection current to create sidebands on the carrier of the longitudinal modes. In addition, in order to provide narrow longitudinal modes, the injection laser may advantageously comprise an active or gain material joined at one end to a passive waveguide in accordance with my previous work, in which case the desired sidebands can be created by modulating the amplitude of a current through all or part of the passive waveguide.

BRIEF DESCRIPTION OF THE DRAWING

A complete understanding of the present invention may be gained by considering the following detailed description in conjunction with the accompanying drawing in which.

To facilitate reader understanding, identical reference numerals are used to designate elements common to the figures.

DETAILED DESCRIPTION

To simplify and clarify the drawing, only sufficient detail is shown in the figures to enable one skilled in the art to understand the operation of the inventive structure shown therein. This drawing, along with the following description and the knowledge of individuals skilled in the art, will readily enable those individuals to fabricate structures suitable for various applications and incorporating these inventive teachings.

Figure 1:
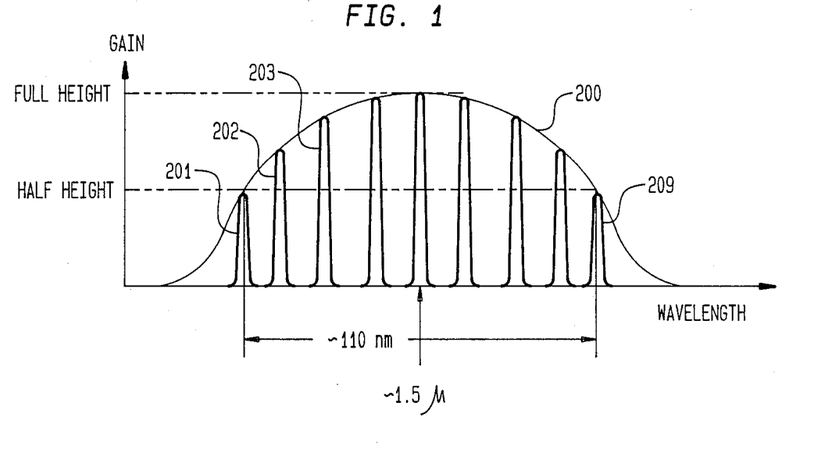
FIG. 1 shows in graphical form, the gain distribution of a typical injection laser in the art.

FIG. 1 shows, in graphical form, envelope 200 of the gain distribution of a typical injection laser known in the art which has a number of longitudinal modes 201–209. In particular, for an embodiment where the active material comprises alloys of InGaAsP, the half height width of the gain distribution is about 110 nanometers. In the typical case shown in FIG. 1, where the laser cavity is 250 to 300 microns in length, there is little or no overlap in the photon distributions of the longitudinal modes. Therefore, in order to produce single longitudinal mode output, it is necessary to utilize a mode selection means. A typical mode selection means used in the art is laser cavity mirrors having wavelength dependent reflectivity. For example, by using a sharply tuned reflector, a laser can be made to oscillate over a range of perhaps 50 nanometers.

I have discovered that nearly single longitudinal mode output from an injection laser may be achieved without using a mode selective loss mechanism. This is achieved through mode coupling of adjacent longitudinal modes. In accordance with the present invention, this longitudinal mode coupling is accomplished by placing a carrier signal on the laser injection current. By modulating the injection current with a sinusoidal signal, sidebands are produced on the photon distributions of the longitudinal modes, for example at first order, second order and so on. Many different forms of modulation, for example amplitude, frequency or phase modulation, can be used. When the sidebands are of a sufficient magnitude, then the photon distributions of the adjacent longitudinal modes overlap. This overlap causes absorption and emission at the frequency of the sidebands created on the longitudinal modes, i.e., an electron-hole pair can be generated in one mode and re-emit in another mode. Electron-hole pairs generated by the sidebands produced by the sinusoidal signal are shared by adjacent modes and energy is transferred between the modes. Without using any additional mode or frequency selective mechanisms, the longitudinal mode situated nearest the peak of the semiconductor gain distribution will prevail. In this manner, mode coupling and single longitudinal mode output, as a result thereof, can be accomplished even though the natural line width of the laser gain distribution is very narrow. Advantageously, such an embodiment achieves single longitudinal mode laser output without using mode selective means, i.e., one may use broadband mirrors for the laser cavity. To avoid nonlinear effects such as compression, the sinusoidal signal should preferably have an amplitude which confines the laser perturbation to the "small signal regime". This is because compression would be stronger on the mode having the most power, and that is counterproductive in this case.

In addition to the above-discussed provisions for single longitudinal mode output, in order to provide single mode laser output, the transverse structure of the laser must be designed to maintain a single transverse mode, e.g., buried heterostructures, dual-channeled buried heterostructures, ridge or rib waveguides and strip contact defined structures. These are described in further detail hereinbelow.

A laser cavity length for the above-described injection current modulator embodiments, which utilize a carrier signal imposed on the laser injection current, may be determined as follows. For a Farby-Perot laser cavity, the spacing between longitudinal modes is inversely proportional to cavity length and is approximately given by:

$$DL = LP^2/(2 \times NG \times LT) \qquad (1)$$

where:
  LP is the central wavelength of the structure,
  NG is the group index of refraction, i.e., approximately 4 for an injection laser fabricated from InGaAsP alloys, and
  LT is the total laser cavity length.

Consider a laser cavity length of LT=1000 microns and LP=1.3 microns, then DL, the wavelength difference between longitudinal modes, equals 2.1 Angstroms. This wavelength difference corresponds to a frequency difference between longitudinal modes of approximately 37 GHz. In this case, a 37 GHz sinusoidal signal would be adequate to provide mode coupling. The 37 GHz carrier signal can be produced by Gunn oscillators known in the art, for example, the type of Gunn oscillator used in millimeter wave oscillators.

Figure 2:
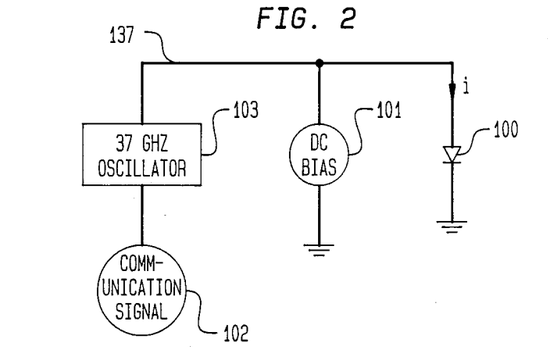
FIG. 2 shows a block diagram of a transmitting end of a coherent lightwave communication system fabricated in accordance with the present invention.

Injection current modulator embodiments of the present invention can be used in the transmitting end of a coherent communications system in the manner shown in FIG. 2. Laser diode 100 is biased to normal average output power by DC bias source 101. Communications signal source 102, for example, a television signal, is AM, FM, or phase modulated with the 37 GHz output of oscillator 103. The resultant signal appearing on lead 137 is applied to laser diode 100 to vary its injection current, i. The receiver of the communications system (well known in the art and not shown) filters out the 37 GHz sinusoidal signal and then demodulates the received signal to recover the communications signal in a manner known in the art.

Figure 3:
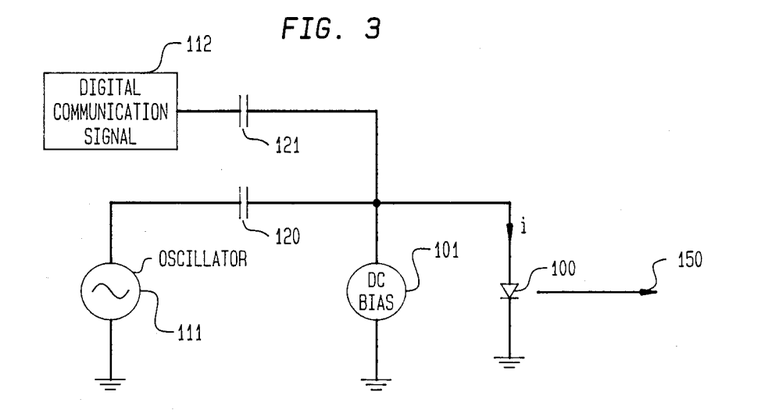
FIG. 3 shows a block diagram of a transmitting end of a digital lightwave communication system fabricated in accordance with the present invention.

Injection current modulator embodiments of the present invention can be used in the transmitting end of a digital communications system in the manner shown in FIG. 3. Laser diode 100 is biased to just below threshold by DC bias source 101. Digital communications signal 112, for example, a PCM signal, is applied, through capacitor 121, to laser diode 100. This signal varies laser injection current, i, from just below the dc bias threshold for a "no pulse" condition to a value above the dc bias threshold for a "pulse". The single mode output is achieved by imposing a 37 GHz sine wave signal from oscillator 111, through capacitor 120, to laser diode 100.

The bit rate that can be sustained with a digital communications system using an injection laser fabricated in accordance with the present invention can be readily approximated. To do this, the spectral width of the laser output pulses must first be determined. With this information, the amount of pulse spreading in a optical fiber can be calculated, and thereafter, using a typical "system design criterion" for a value of dispersion to pulse spacing, the bit rate can be approximated.

For example, assume the laser cavity length LT=1000 microns, the laser output wavelength LP=1.3 microns, and the laser injection current sinusoidal signal has a frequency of 37 GHz. The spectral width for the single longitudinal mode laser output is determined by the first sideband of the sinusoidal signal in accordance with the following equation:

$$\text{Total spectral width } (TW) = 2 \times f \times LP/f_0 \quad (2)$$

where LP=1.3 microns, f=37 GHz, and $f_0 2.3 \times 10^{14}$ is the frequency corresponding to LP. This gives TW=0.418 nanometers. Thus, for a typical optical fiber having a fiber dispersion of 18 psec/km-nm, and at a 40 km spacing between repeaters on the communications system, the dispersion due to transmission of the laser output over the optical fiber is 0.418×40×18, or approximately 300 psec.

If the "system design criterion" calls for dispersion to be approximately ¼ of the pulse spacing, the bit rate for a system using the inventive laser would be=1000/(300×4) GHz=0.833 GHz or 833 MHz. (Thus, for the digital system shown in FIG. 3, the clock for the digital pulses could be run at an integer divisor of the oscillator clock, for example ¼, in order to meet the "system design criterion".)

Embodiments of the present invention only select a single longitudinal mode. Therefore, in order to have narrow bandwidth output, the laser structure must provide narrow longitudinal modes. This is achieved in preferred embodiments of the present invention which utilize active-passive structure which is based on my prior work and on which is the subject of a separate patent application. This active-passive structure is described hereinbelow.

Figure 4:
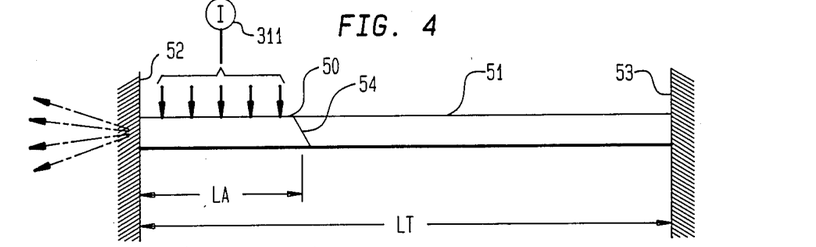
FIG. 4 shows, in pictorial form, the general structure of active-passive embodiments of the present invention.

FIG. 4 shows, in block form, the general structure of active-passive injection lasers. Relatively low-loss passive waveguide 51 is disposed adjacent to active gain region 50 in a laser cavity formed by broadband mirrors 52 and 53. In accordance with the present invention, active gain region 50 is pumped by injection current from a modulating current source 311. Passive waveguide 51 is an index-guided region in which an electromagnetic wave is carried between mirror 53 and the interface between regions 50 and 51, i.e., junction 54. The index of refraction of passive waveguide 51 should be substantially equal to that of active region 50 in order to reduce multicavity interference effects. In addition, in order to eliminate any reflections at the boundary of the active and passive regions, the boundary is fabricated at an angle to the direction of the laser light in the cavity. This further assures that any light that is reflected from the boundary will not remain within the waveguides.

Active region 50 may either be gain-guided or index-guided according to the particular embodiment, as is more fully described hereinbelow.

In an illustrative embodiment of the active-passive structure, using semiconductors, passive waveguide region 51 is a semiconductor material having a larger bandgap than active region 50. Thus, photons generated in active region 50 do not interact in passive waveguide 51. Passive waveguide 51 is formed from an alloy which has a different composition from that of active region 50. Because the alloy providing a larger bandgap for passive waveguide 51 results in an index of refraction which is very close to that of active region 50, there is no appreciable reflection at junction 54. In other embodiments, passive waveguide 51 could be a different material from that of active region 50. For example, active region 50 could be a III-V compound or an alloy of III-V materials and passive waveguide 51 could be SiN or glasses of various kinds.

Figure 5:
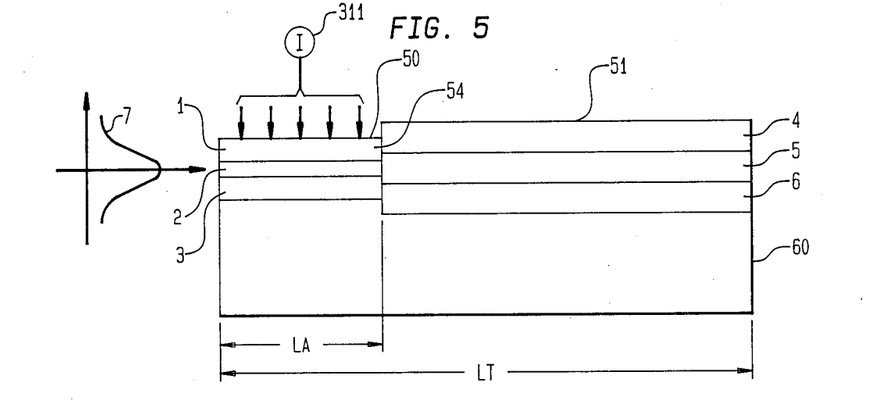
FIG. 5 shows, in pictorial form, an active-passive embodiment of the present invention in which the active region and the passive waveguide region are fabricated from semiconductor materials.

FIG. 5 shows an "all-semiconductor" embodiment of the active-passive structure, and more particularly, shows a slice through the structure taken substantially perpendicular to the top and bottom surfaces and along its longitudinal axis, i.e., the latter being the direction of laser beam propagation in the laser cavity. As shown in FIG. 4, current source 311 provides a modulated injection current a for active gain region 50. Layers 1, 2, 3, 4, 5 and 6 are epitaxially grown on InP substrate 60 by liquid phase epitaxy (LPE) or other techniques well known in the art. For clarity, FIG. 5 only shows those layers directly involved in lightwave generation and guidance. It is well known in the art that other layers may be situated on top of layer 1 both to facilitate electrical contact and also to confine the injection current, which provides carriers to active region 50, to a narrow stripe in order to provide transverse guidance of the laser beam. Layer 2 is an active InGaAsP semiconductor alloy layer having a thickness in the range of 0.1 to 0.2 microns. Layers 1 and 3 are light guidance and carrier-confinement layers which have a larger bandgap than layer 2 and may illustratively be InGaAsP alloys or InP. The compositions of the layers change at junction 54 in order to form passive waveguide 51. Layers 4, 5 and 6 comprise passive waveguide 51. Layer 5 has a larger index of refraction than layers 4 and 6. Illustratively, layer 2 can have a bandgap with an emission peak at 1.5 microns and layer 5 can have a bandgap with an emission peak at 1.3 microns. Thus, photons generated in layer 2 will not have enough energy to be absorbed in layer 5.

Because of the above-described guidance properties of the structure, the peak photon density in the structure occurs in or near layers 2 and 5, with decreasing density occurring in the adjacent cladding layers. This is illustrated by curve 7 in FIG. 5.

Figure 6:
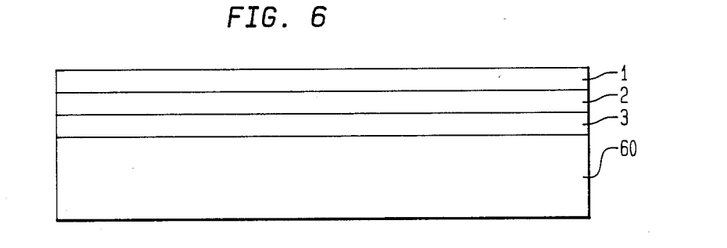
FIGS. 6–8 show, in pictorial form, structures formed at various stages in the fabrication of the embodiment shown in FIG. 5.

A method for fabricating the embodiment shown in FIG. 5 will now be described. FIG. 6 shows InP substrate 60. Epitaxial layers 1, 2 and 3 are grown over the entire surface of substrate 60. Then, as shown in FIG. 7, after photolithography and well known etching techniques are applied to the structure shown in FIG. 6, a portion of these layers is removed to expose InP substrate 60 in the region which is to become the passive region of the final laser structure.

Figure 7:
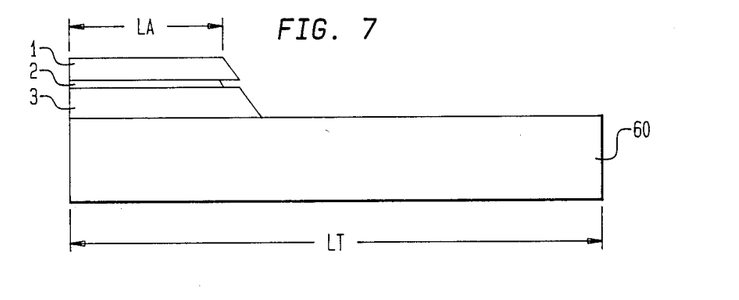
Figure 8:
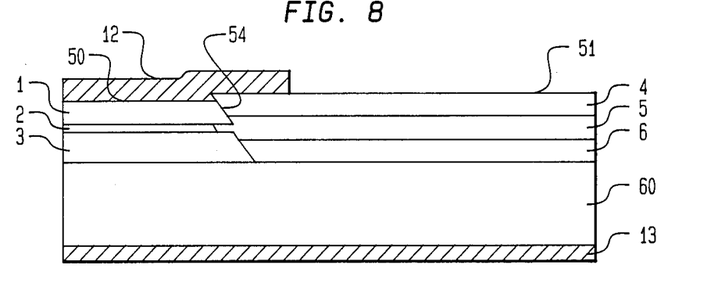

FIG. 8 shows the structure resulting after layers 6, 5 and 4 are epitaxially grown on the structure shown in FIG. 7. Metal layer 12 has been deposited in areas where current flow is desired. Metal layer 13 acts as an electrode, along with layer 12, for current injection and as a heat sink for the structure. Note that junction 54, between active region 50 and passive waveguide 51, need not be perpendicular to the direction of light propagation because the change in the index of refraction across the junction is small and therefore causes little reflection or deflection of the lightwaves in the laser cavity. Also, as noted above, there is some advantage in having the junction oriented at an angle to the direction of light propagation, i.e., to deflect reflected rays out of the waveguides.

As discussed above, in order to provide single mode laser output, the transverse structure of the laser must be designed to maintain a single transverse mode. Note that passive waveguide 51 need not support only a single transverse mode as long as active region 50 does. Many standard laser structures for guiding the laser beam in the transverse plans perpendicular to the direction of propagation of the laser beam and having a single transverse mode are known in the art, e.g., buried heterostructures, dual-channeled buried heterostructures, ridge or rib waveguides and stripe contact defined structures.

Figure 9:
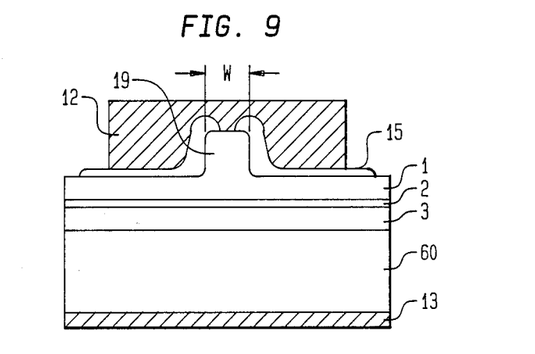
FIG. 9 shows, in pictorial form, an active-passive embodiment of the present invention in which a ridge waveguide structure is used to provide a single transverse mode in the active region.

A version of a ridge waveguide is shown in FIG. 9 which depicts a slice taken through the active region of the structure in a plane perpendicular to the direction of propagation of the laser beam. Specifically, layer 1 has ridge 19 of width W and is partially covered by SiN insulating layer 15. In order to maintain a single transverse mode, in an illustrative embodiment of the invention, W is approximately 5 microns. Ridge 19 can be fabricated to extend across the entire length, LT, of the laser, i.e., covering both active region 50 and passive waveguide 51.

Figure 12:
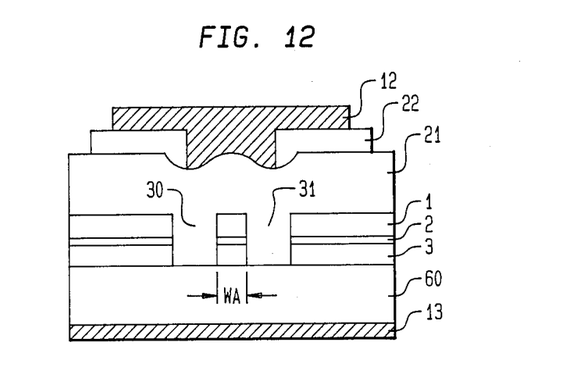
FIG. 12 shows, in pictorial form, an active-passive embodiment of the present invention in which a dual-channel buried heterostructure is used to provide transverse guidance in the active region.

Another structure for providing transverse guidance in active region 50 is a dual-channel buried heterostructure. This is shown in FIG. 12. After growing layers 3, 2 and 1, a pair of channels 30 and 31 are etched to leave a mesa having width WA. Then, a lower index layer 21, often InP, which serves as a confining region, may be grown in the groove. Channels 30 and 31 may extend the entire length LT of the laser structure. Layers 12 and 13 are metallic contact layers; layer 60 is an n-InP substrate; layer 3 is an n-InGaAsP layer; layer 2 is a p-InGaAsP layer; layer 1 is a p-InP layer; layer 21 is a p-InP layer and layer 22 is a SiO$_2$ layer. An example of a dual-channel buried heterostructure is shown in the *Technical Digest OFC '84 O.S.A. Meeting on Optical Fiber Communication*, Jan. 23-25, 1984, paper MF2, FIG. 1, page 15.

A further well-known structure, not shown in the figures, for providing transverse guidance in active region 50 is a stripe-contact current injection structure.

The structures providing transverse guidance in active region 50 may alternatively be fabricated by bombarding the areas adjacent to active region 50 to make them highly resistive instead of using insulating layers as previously described. Furthermore, injection current top contact 12 can be extended over passive waveguide 51 to further reduce photon absorption in the waveguide. However, when the gain peak for passive waveguide 51 is chosen to be 1.3 microns, there will only be a small improvement in performance due to the extended top contact when active region 50 emits at 1.5 microns.

Figure 10:
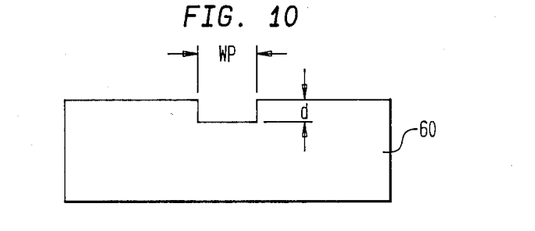
FIGS. 10 and 11 show, in pictorial form, structures formed at various stages in the fabrication of an active-passive embodiment of the present invention having transverse guidance in the passive region.
Figure 11:
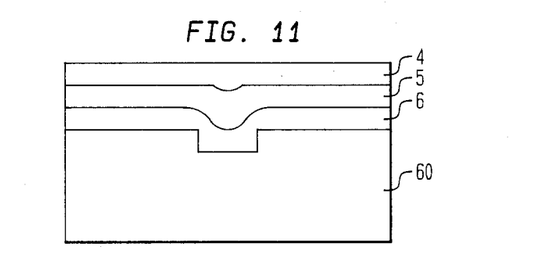

A structure providing transverse guidance in passive waveguide 51, independent of active region 50, is fabricated as shown in FIGS. 10 and 11. A groove having width WP and depth d is etched in InP substrate 60. Illustratively, WP is approximately 10 microns and d is between 3 and 5 microns. Layers 6, 5 and 4, which together form passive waveguide 51, are epitaxially grown on the structure shown in FIG. 10 to produce the structure shown in FIG. 11. Illustratively, layer 6 is grown with a thickness of approximately 1 micron, layer 5 with a thickness of approximately 2 microns and layer 4 with a thickness of approximately 1 micron. The bulge caused by the groove in substrate 60 will cause layer 5 to confine lightwave energy in the transverse direction. Then layer 3, situated in the active region, as shown illustratively in FIG. 9, is grown sufficiently thick to isolate active layer 2, as shown illustratively in FIG. 9, from the effects of the groove in substrate 60 and to ensure that active layer 2 will mate with passive layer 5. The structure providing transverse guidance for the active region can be chosen to be any of the well known structures, e.g., the structure shown in FIG. 9.

Figure 13:
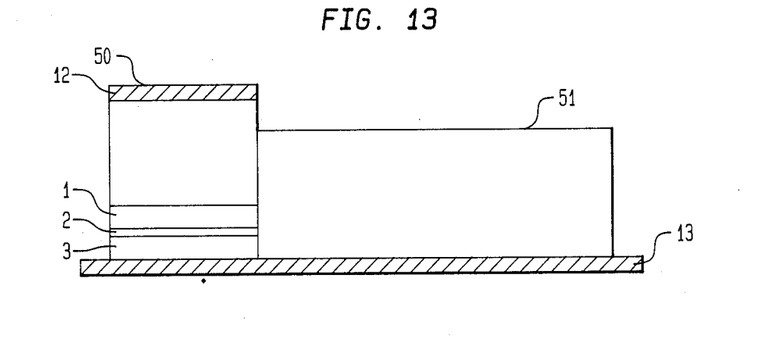
FIG. 13 shows, in pictorial form, an active-passive embodiment of the present invention in which an active laser region is butt-joined to a passive waveguide region.

Alternative embodiments of the present invention are fabricated by butt-joining a conventional injection laser to a passive waveguide structure. For example, FIG. 13 shows passive waveguide structure 51 lined up with active region 50 on heat sink 13. Active region 50 is disposed directly on heat sink 13.

Figure 14:
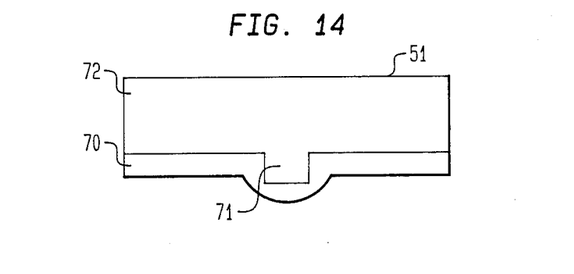
FIGS. 14 and 15 show, in pictorial form, two views of an illustrative $SiO_2$ glass system passive waveguide structure used in the embodiment shown in FIG. 13.

FIG. 14 shows a cross section of an illustrative passive waveguide structure 51 fabricated in an SiO$_2$ glass system. The plane of FIG. 14 is perpendicular to the direction of laser beam propagation in the structure. Waveguide layer 71 is germanium-doped SiO$_2$ and is fabricated by growing a germanium-doped SiO$_2$ layer over the entire face of SiO$_2$ substrate 72. Then the germanium-doped SiO$_2$ layer is etched to form waveguide layer 71 having a 5 micron square cross section. Waveguide layer 71 is then covered with 2 micron thick SiO$_2$ layer 70.

Figure 15:
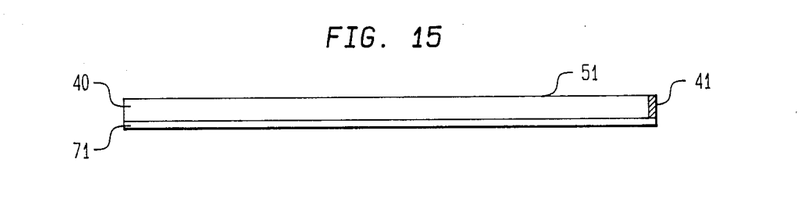

FIG. 15 shows a slice through passive waveguide structure 51, shown in FIG. 14, taken along its longitudinal axis, i.e., the direction of laser beam propagation. End 41 of passive waveguide 51, opposite the active region, could have a simple mirror coating, either metallic or dielectric, to form a broad-band reflector.

Figure 16:
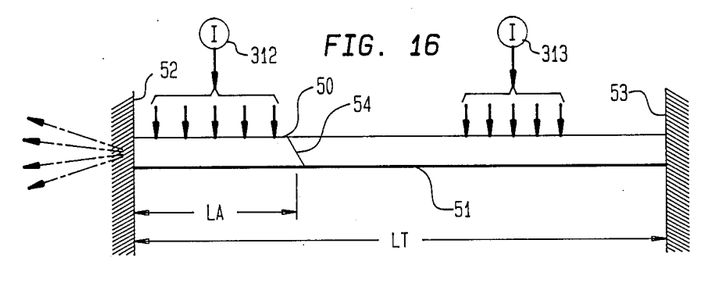
FIG. 16 shows, in pictorial form, the general structure of active-passive embodiments of the present invention in which a current through the passive waveguide is modulated.

Although the active-passive structure described hereinabove has been discussed in terms of modulating the injection current to achieve mode coupling, a similar advantageous result can be realized by modulating a current which passes through all or parts of the passive region. By modulating the amplitude of a current through the passive region, changes in the index of refraction of the passive region are induced which modulate the phase of the lightwave flowing through the region to create the desired sidebands. This is shown in FIG. 16 which shows, as in FIG. 4, the general structure of active-passive injection lasers. In this embodiment, the active gain region 50 is pumped by injection current from a current source 312 while current source 313 provides an amplitude modulated current through the passive waveguide region 51.

It should also be clear to those skilled in the art that further embodiments of the present invention may be made by those skilled in the art without departing from the teachings of the present invention.

What is claimed is:

1. An injection laser comprising:
   an active material disposed in a laser cavity,
   means for injection pumping the active material with an injection current to produce radiation having longitudinal modes,
   characterized in that
   the laser further comprises means for spreading the longitudinal modes so that some adjacent longitudinal modes overlap, the means for spreading comprising means for modulating a current through the laser at a modulating frequency corresponding to the wavelength separation of the longitudinal modes.

2. The injection laser of claim 1 wherein the means for injection pumping comprises means for injection current pumping and the means for modulating modulates the injection current by amplitude, frequency or phase modulation.

3. The injection laser of claim 1 wherein the active material has a first end, the laser further comprising:
   a passive waveguide region having an index of refraction which is substantially equal to the index of refraction of the active material and a first end, and the active material and the passive waveguide material are disposed against one another at the first ends of each one.

4. The injection laser of claim 3 wherein the means for modulating a current through the laser comprises means for amplitude modulating a current flowing through the passive region.

5. The injection laser of claim 3 wherein the length of the passive wavelength region is substantially greater than the length of the active material.

6. The injection laser of claim 3 wherein the passive waveguide region comprises a semiconductor material having a bandgap which is larger in energy than the energy of a photon of the radiation generated in the active material.

7. The injection laser of claim 3 wherein the first partial reflector is a multi-layer dielectric.

8. The injection laser of claim 3 wherein the active region is a buried heterostructure.

9. The injection laser of claim 3 wherein the active region is a dual-channel buried heterostructure.

10. The injection laser of claim 3 wherein the active region ia a ridge waveguide structure.

11. The injection laser of claim 3 wherein the active region is comprised of alloys of III-V compounds.

12. A transmitter of a signal for a communications system which comprises:
an active material disposed in a laser cavity,
means for injection pumping the active material to produce radiation having longitudinal modes, and
means for modulating the signal and producing a further signal, the further signal being applied to the active material to vary the radiation output from the cavity and to modulate the injection pumping to spread the longitudinal modes so that some adjacent modes overlap, the further signal modulating the injection pumping at a frequency corresponding to the wavelength separation of the longitudinal modes.

13. A transmitter of a digital signal having pulses for a communications system which comprises:
an active material disposed in a laser cavity,
means for injection pumping the active material below threshold for producing laser radiation having longitudinal modes, and
means for modulating the digital signal and producing a further signal, the further signal being applied to the active material to pump the active material above threshold when pulses appear in the digital signal and to modulate the injection pumping to spread the longitudinal modes so that some adjacent modes overlap, the further signal modulating the injection pumping at a frequency corresponding to the wavelength separation of the longitudinal modes.

* * * * *

UNITED STATES PATENT AND TRADEMARK OFFICE
CERTIFICATE OF CORRECTION

PATENT NO. : 4,747,107
DATED : May 24, 1988
INVENTOR(S) : Stewart E. Miller

It is certified that error appears in the above-identified patent and that said Letters Patent is hereby corrected as shown below:

In the Abstract, line 3, "a to small" should read --a small--.

Column 4, line 60, "a optical" should read -- a typical optical--.

Column 5, line 6, "$f_0 2.3$" should read --$f_0=2.3$--.

Signed and Sealed this

Ninth Day of May, 1989

*Attest:*

DONALD J. QUIGG

*Attesting Officer*  *Commissioner of Patents and Trademarks*